(12) United States Patent
Shotey et al.

(10) Patent No.: US 8,946,550 B1
(45) Date of Patent: Feb. 3, 2015

(54) ELECTRICAL DEVICE COVER

(75) Inventors: Marcus J. Shotey, Scottsdale, AZ (US);
Edgar W. Maltby, Mesa, AZ (US);
Jeffrey P. Baldwin, Phoenix, AZ (US);
Richard L. Cleghorn, Tempe, AZ (US);
Andre Baca, Phoenix, AZ (US);
Kenneth C. Booth, Mesa, AZ (US)

(73) Assignee: Hubbell Incorporated, Shelton, CT (US)

( * ) Notice: Subject to any disclaimer, the term of this patent is extended or adjusted under 35 U.S.C. 154(b) by 385 days.

(21) Appl. No.: 13/357,530

(22) Filed: Jan. 24, 2012

Related U.S. Application Data

(63) Continuation of application No. 12/143,549, filed on Jun. 20, 2008, now Pat. No. 8,101,860.

(60) Provisional application No. 60/945,186, filed on Jun. 20, 2007, provisional application No. 60/972,346, filed on Sep. 14, 2007, provisional application No. 60/972,011, filed on Sep. 13, 2007.

(51) Int. Cl.
*H02G 3/14* (2006.01)
*H02G 3/08* (2006.01)
*H05K 5/03* (2006.01)

(52) U.S. Cl.
CPC .................. *H02G 3/14* (2013.01); *H02G 3/081* (2013.01); *H05K 5/03* (2013.01)
USPC ................. 174/66; 174/67; 174/53; 220/241; 220/242; 439/536; D13/177

(58) Field of Classification Search
CPC ......... H02G 3/14; H02G 3/018; H02G 3/083; H01R 13/74; H01R 13/5213; H05K 5/03
USPC ........ 174/66, 67, 50, 53, 57, 58; 220/3.2–3.9, 220/241, 242; 439/139, 142, 535, 536, 135; D13/177; 200/333; D8/350, 353
See application file for complete search history.

(56) References Cited

U.S. PATENT DOCUMENTS

| | | | | | |
|---|---|---|---|---|---|
| 1,784,277 | A | * | 12/1930 | Darlington | 174/66 |
| 3,437,738 | A | * | 4/1969 | Wagner | 174/66 |
| 4,012,580 | A | * | 3/1977 | Arnold | 174/53 |
| 5,763,831 | A | | 6/1998 | Shotey | |
| 5,907,126 | A | * | 5/1999 | Cancellieri et al. | 174/66 |
| 6,133,531 | A | | 10/2000 | Hayduke et al. | |
| 6,420,653 | B1 | | 7/2002 | Shotey et al. | |
| 6,616,005 | B1 | * | 9/2003 | Pereira et al. | 174/66 |
| 7,282,643 | B2 | | 10/2007 | Maltby et al. | |
| 7,880,086 | B1 | * | 2/2011 | Shotey et al. | 174/66 |
| 8,299,358 | B2 | * | 10/2012 | Huang | 174/66 |

OTHER PUBLICATIONS

Pass & Seymour, Screwless Wall Plates, 2007.

* cited by examiner

*Primary Examiner* — Angel R Estrada
(74) *Attorney, Agent, or Firm* — Roylance, Abrams, Berdo & Goodman, L.L.P.

(57) ABSTRACT

An electrical device cover configured for mounting over an electrical device comprises a frame including a frame channel and an frame opening. The frame opening is defined by at least four sides and is large enough to receive at least one electrical device. A sliding tab comprising a screw channel is provided, the sliding tab is slidably coupled with the frame channel and is slideable to a closed position in which the screw channel at least partially surrounds a box mounting screw of the at least one electrical device.

20 Claims, 20 Drawing Sheets

ELECTRICAL DEVICE COVER

CROSS REFERENCE TO RELATED APPLICATIONS

This document is a Continuation of the earlier U.S. patent application Ser. No. 12/143,549 to Shotey et al. entitled "Electrical Device Cover," which was filed on Jun. 20, 2008, which application claims the benefit of the filing date of U.S. Provisional Patent Application 60/945,186 to Shotey, et al. entitled "Fast-Mount Electrical Device Cover," which was filed on Jun. 20, 2007, U.S. Provisional Patent Application 60/972,346 to Shotey, et al. entitled "Fast Mount Electrical Device Frame with Snap-In Cover," which was filed on Sep. 14, 2007, and U.S. Provisional Patent Application 60/972,011 entitled "Electrical Cover Plate with Sliding and Locking Base," which was filed on Sep. 13, 2007, the disclosures of which are hereby incorporated herein by reference.

BACKGROUND

1. Technical Field

Aspects of this document relate generally to covers for electrical devices.

2. Background Art

Traditional screw-mounted electrical device covers are well-known in the art. Some conventional screw-mounted covers couple directly to the electrical device through a center-mount screw. Other conventional screw-mounted covers couple to the electrical outlet box through the box mounting screws. Some conventional screw-mounted electrical device covers also use a cover plate that is snapped on to a base to cover the electrical device while providing aesthetic appeal. Some conventional screw-mounted electrical device covers use a keyhole slot at the box mounting screw aperture for simpler installation than with just a standard round hole. Several examples of keyhole slot configurations known in the art are shown and described in U.S. Pat. No. 6,420,653.

SUMMARY

Aspects of this document relate to electrical device covers.

In one aspect, an electrical device cover configured for mounting over an electrical device comprises a frame comprising a frame channel and a frame opening. The frame opening is defined by at least four sides and is large enough to receive at least one electrical device. A sliding tab comprising a screw channel is provided. The sliding tab is slidably coupled with the frame channel and is slideable to a closed position in which the screw channel at least partially surrounds a box mounting screw of the at least one electrical device.

Particular implementations may include one or more of the following. The frame opening may be defined by a one piece frame comprising the at least four sides. The sliding tab may comprise a slide bar, the slide bar may extend across the box mounting screw and at least a second box mounting screw. The sliding tab may comprise a push tab comprising a locking clip extending from a side of the push tab, the locking clip configured to engage the frame adjacent to the frame channel. The sliding tab and frame may be formed as separate pieces. The frame opening may comprise at least one screw channel disposed along a perimeter of the frame opening. The sliding tab may comprise one or more stops extending from one or more sides of the sliding tab. A cover plate coupled with the frame at the frame opening may be provided, the cover plate configured to cover at least a portion of the at least one electrical device. A lid hingedly coupled to the frame may be provided.

In another aspect, an electrical device cover configured for coupling to one or more electrical devices mounted on an electrical box through box mounting screws comprises first and second frame portions, each frame portion comprising a screw channel, a frame channel and a sliding tab. The first and second frame portions are configured for mutual coupling such that the first frame portion sliding tab couples within the second frame portion frame channel and the second frame portion sliding tab couples within the first frame portion frame channel. The mutually coupled first and second frame portions together form a frame opening defined by at least four sides, the frame opening large enough to receive one or more electrical devices. The first and second frame portions are slideable with respect to each other from a first coupled position in which the screw channels from the first and second frame portions are separated enough for the frame opening to placed around a yoke of the electrical device to a second coupled position in which the screw channels from the first and second frame portions are engaged with the box mounting screws.

Particular implementations may include one or more of the following. A cover plate comprising one or more pins extending from a rear surface of the cover plate, the cover plate coupled with the frame by the one or more pins extending through a receiving aperture in the frame may be provided. At least one of the frame channels may further comprise a locking pin slot and at least one of the sliding tabs may further comprise a locking pin; and wherein the locking pin may seat in the locking pin slot in the first coupled position. The locking pin slot may comprise a first locking pin slot and the at least one of the frame channels may further comprise a second locking pin slot. The locking pin may seat in the second locking pin slot in the second coupled position. A lid hingedly coupled to the frame may be provided.

In still another aspect, a method of installing an electrical device cover comprises placing a portion of a frame behind a yoke of an electrical device, aligning a screw channel on a sliding tab slidably mounted in the frame with a mounting screw of the electrical device, sliding the sliding tab toward the mounting screw to a position where the screw channel at least partially surrounds the mounting screw, and tightening the mounting screw against the sliding tab.

Particular implementations may include one or more of the following. Coupling a cover plate with the frame may be provided. Loosening the mounting screw of the electrical device before placing the portion of the frame behind the yoke of the electrical device may be provided.

In yet another aspect, a method of installing an electrical device cover comprises, placing a portion of a frame behind a yoke of an electrical device by placing an opening in the frame over the electrical device, aligning a screw channel associated with the frame with a mounting screw of the electrical device, sliding the frame from a first coupled position where the frame opening is large enough to fit over the electrical device to a second coupled position where the screw channel is engaged with the mounting screw, and tightening the mounting screw of the electrical device on the frame.

Particular implementations may include one or more of the following. The method may further comprise coupling a cover plate over the frame. Coupling the cover plate over the frame may comprise interfacing one or more locking pins extending from a rear of the cover plate with one or more apertures through the frame.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The invention will hereinafter be described in conjunction with the appended drawings, where like designations denote like elements, and.

DESCRIPTION

This disclosure, its aspects and implementations, are not limited to the specific components or assembly procedures disclosed herein. Many additional components and assembly procedures known in the art consistent with the intended electrical device cover and/or assembly procedures for an electrical device cover will become apparent for use with implementations of electrical device covers from this disclosure. Accordingly, for example, although particular frames, frame components, frame channels, channeled boxes, frame openings, sliding tabs, slide bars, pus tabs, locking clips, screw channels, cover plates, cover plate tabs, beveled flanges and locking pins are disclosed, such frames, sliding tabs, cover plates and implementing components may comprise any shape, size, style, type, model, version, measurement, concentration, material, quantity, and/or the like as is known in the art for such frames, sliding tabs, cover plates and implementing components, consistent with the intended operation of an electrical device cover.

Figure 1:
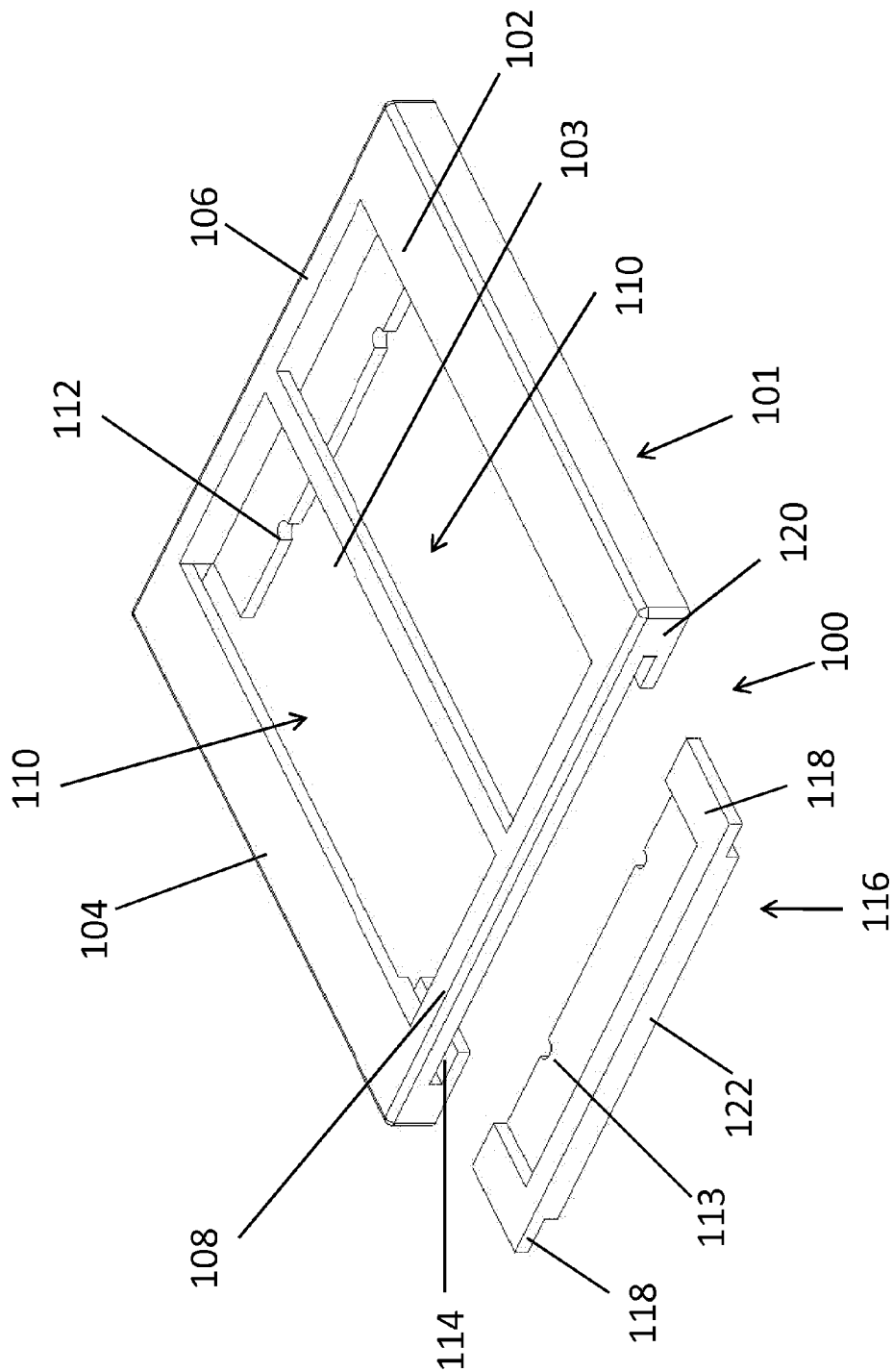
FIG. 1 is a three-quarter perspective view of a first implementation of an electrical device cover frame and sliding tab.
Figure 4:
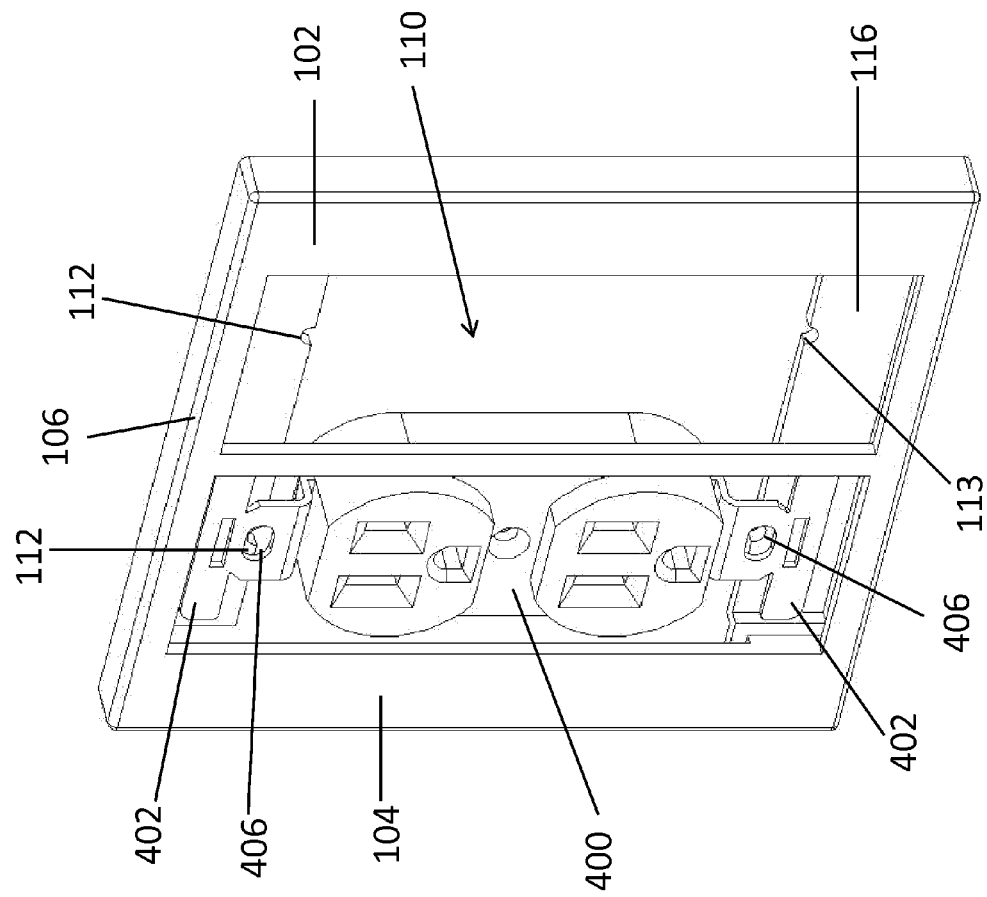
FIG. 4 is a front perspective view of the electrical device cover of FIG. 1 installed on an electrical device.

FIG. 1 illustrates a first implementation of an electrical device cover 100. The electrical device cover 100 comprises frame 101 and at least one sliding tab 116. The sliding tab 116 is configured in this particular implementation as a slide bar 116. Slide bar 116 may comprise bottom edge 122, as well as one or more slide bar flanges 118, which are configured to slidably couple with frame channel 114. Slide bar 116 may further comprise one or more screw channels 113, which are configured to receive one or more mounting screws of an electrical device (FIG. 4). Frame 101 comprises frame channel 114, within which slide bar 116 may slidably couple (via one or more slide bar slide bar flanges 118). Frame 101 may also comprise one or more screw channels 112, which are configured to receive one or more mounting screws of an electrical device (FIG. 4). Frame 101 may further comprise one or more frame openings 110, which are defined by at least four sides. Although most implementations will comprise rectangular frame openings, or openings specifically sized and shaped to receive a particular electrical device, the frame openings 110 may comprise any size, shape and/or dimension. In the particular implementation illustrated in FIG. 1 for a two gang electrical device mounting, the at least four sides comprise first side member 102, second side member 104, center member 103, top member 106 and bottom member 108.

Figure 2:
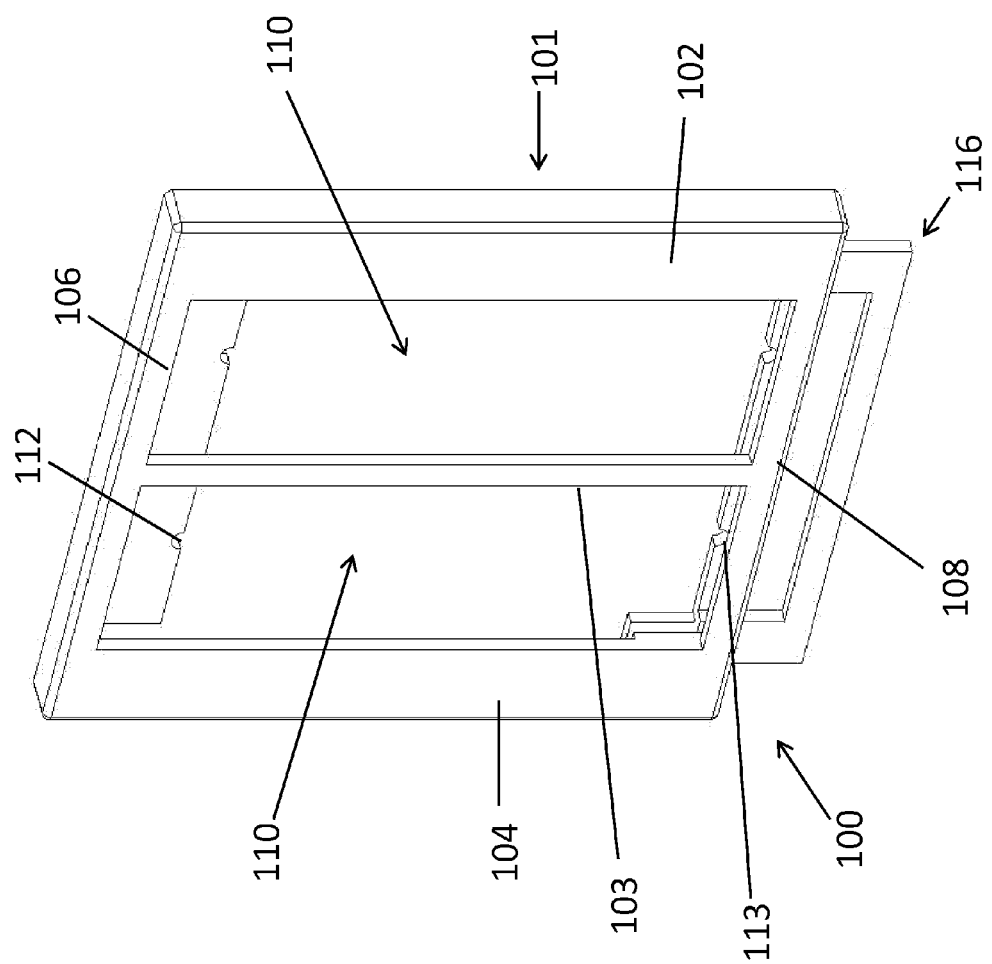
FIG. 2 is a front perspective view of the electrical device cover frame and sliding tab of FIG. 1.
Figure 3:
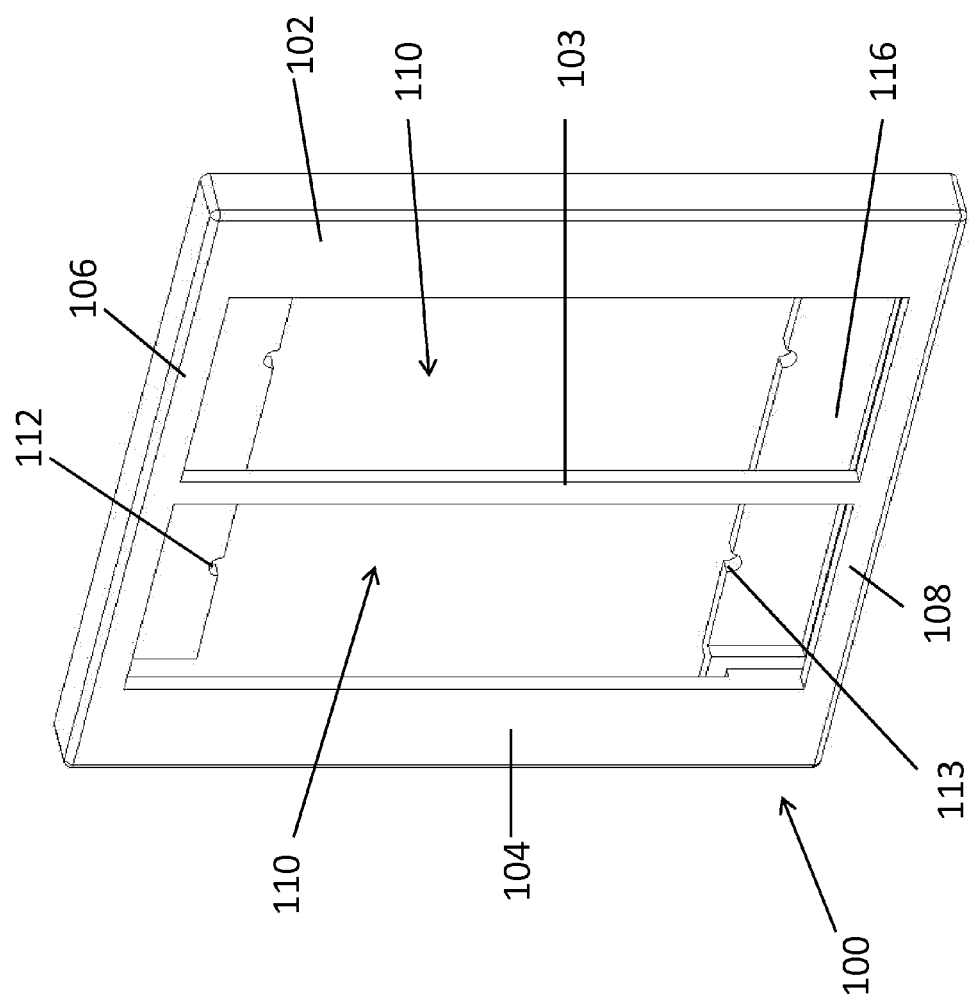
FIG. 3 is a front perspective view of the electrical device cover frame of FIG. 1 with an engaged sliding tab.

FIGS. 2 and 3 illustrate additional views of a first implementation of electrical device cover 100. With one or more slide bar flanges 118 of slide bar 116 aligned in frame channel 114, a user may move slide bar 116 in the direction of top horizontal member 106 until slide bar 116 reaches a fully engaged position with respect to frame 101 (FIG. 3). It will be understood that a fully engaged position exists where bottom edge 122 of slide bar 116 is substantially flush with bottom edge 120 of frame 101. It will be further understood that slide bar 116 and frame channel 114 may be configured to engage via a pressure fit of the one or more slide bar flanges 118 within frame channel 114, or by other locking structures.

Figure 11:
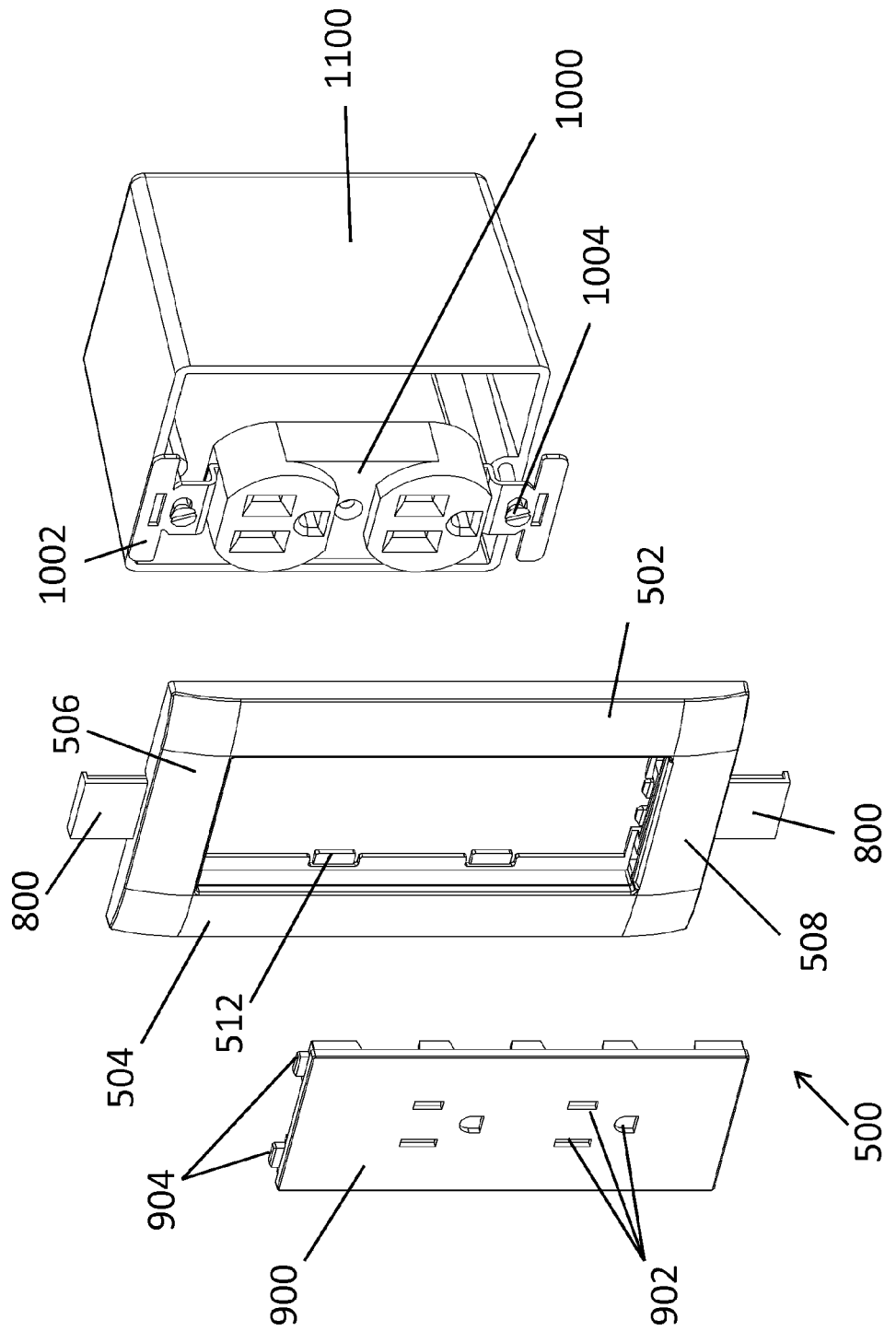
FIG. 11 is a perspective view of the electrical device cover of FIG. 5 in an uninstalled position.
Figure 12:
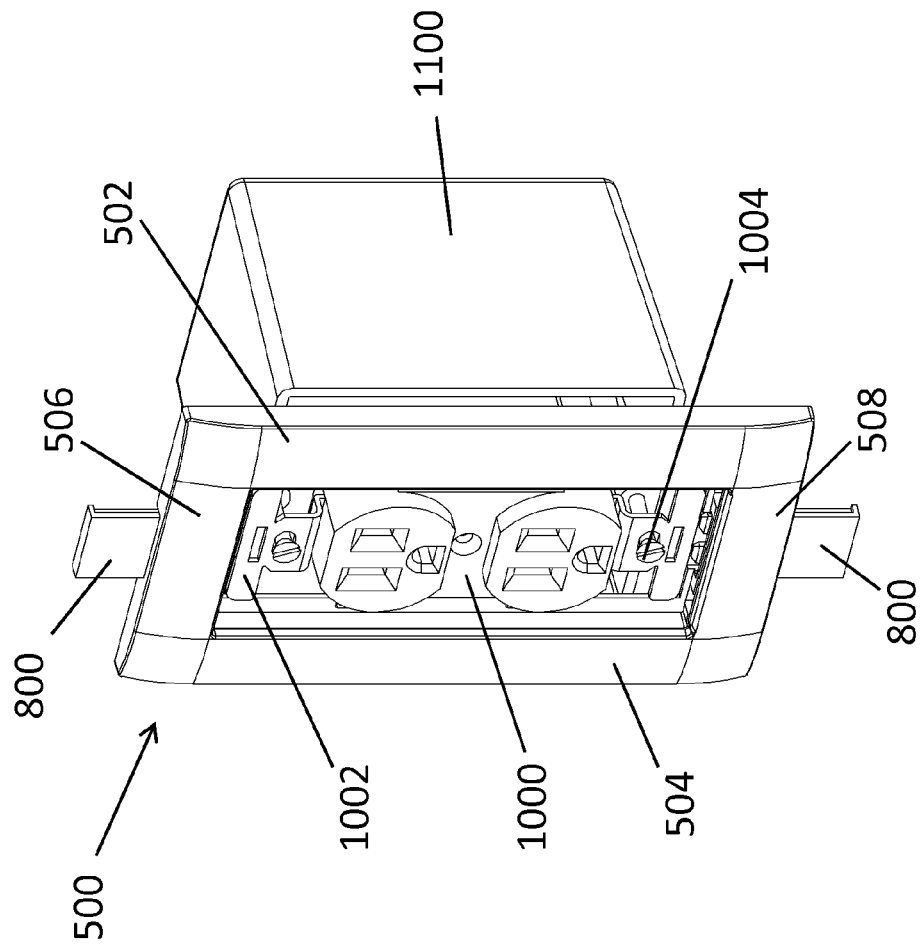
FIG. 12 is a perspective view of the electrical device cover of FIG. 5 in a partially installed position.
Figure 12:
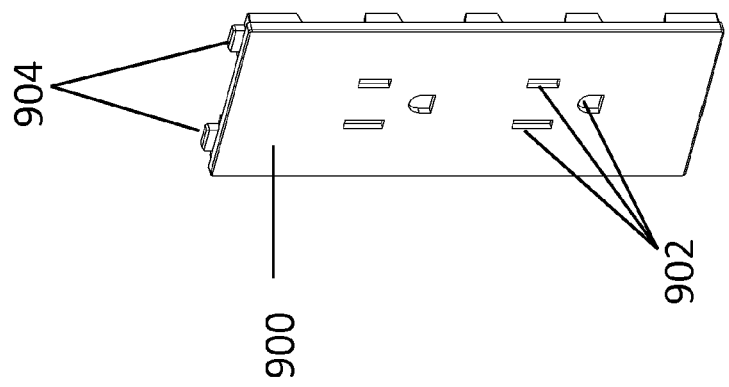
Figure 13:
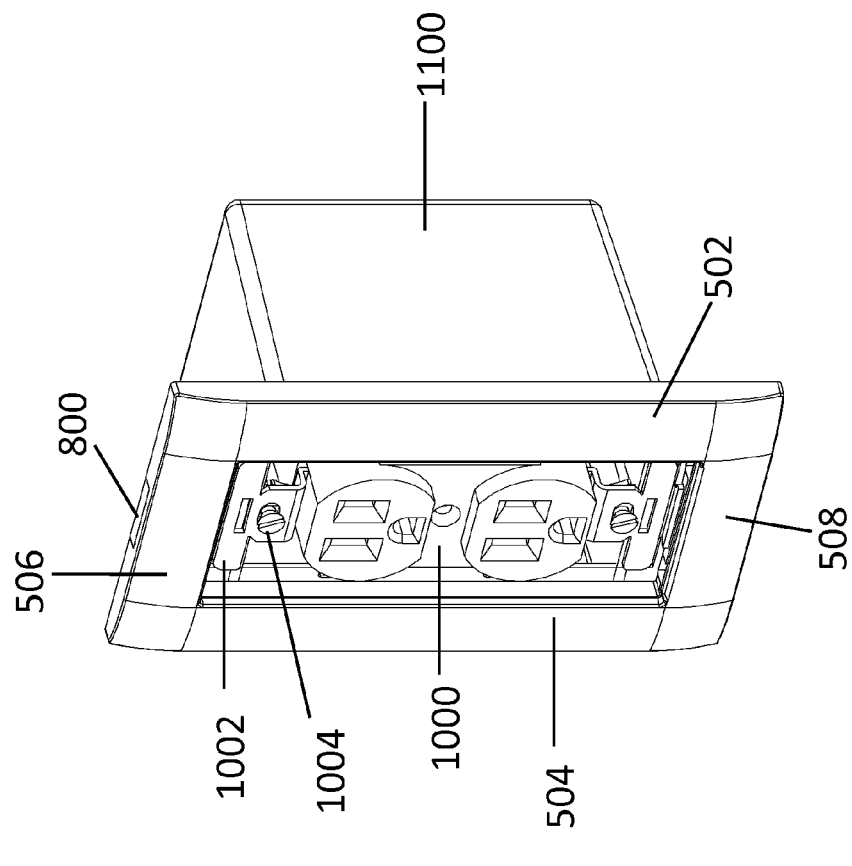
FIG. 13 is a perspective view of the electrical device of FIG. 5 installed on an electrical device with the cover plate removed.
Figure 13:
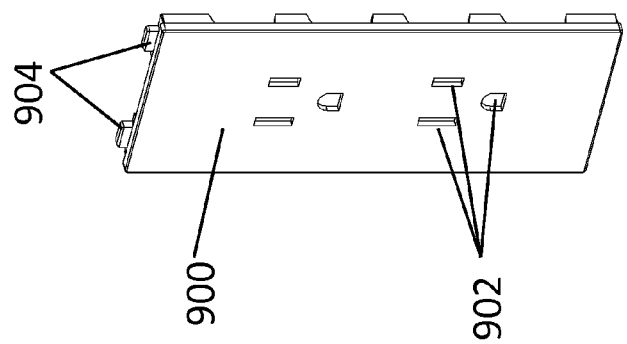
Figure 14:
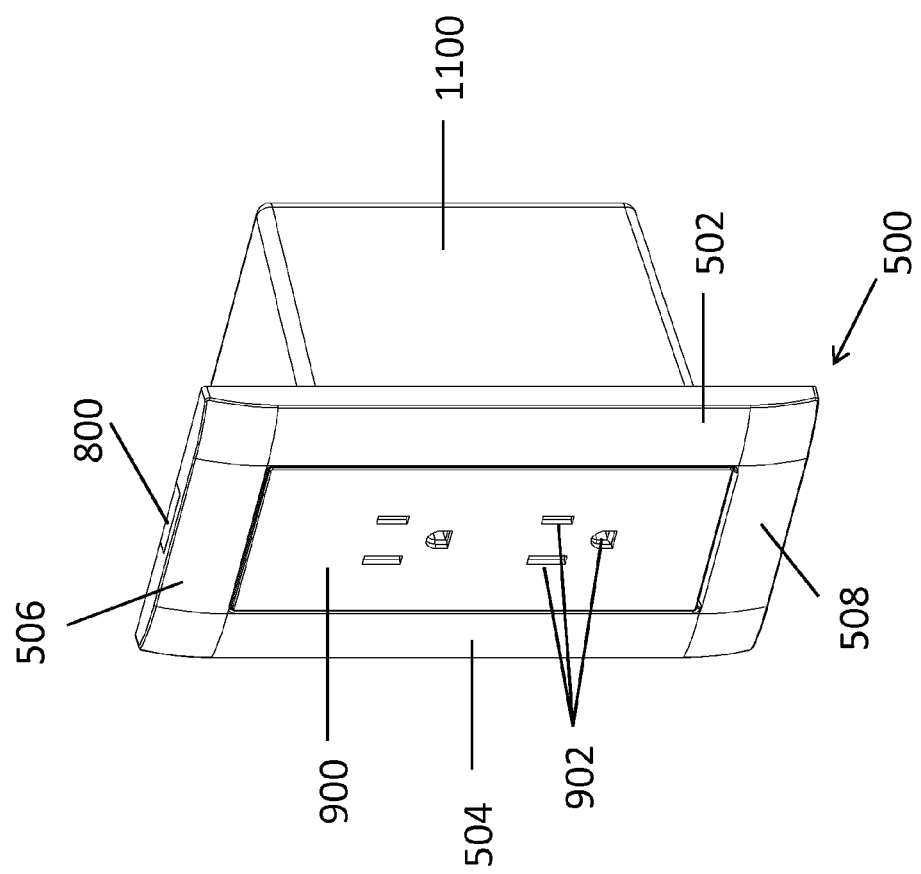
FIG. 14 is a perspective view of the electrical device cover of FIG. 5 installed on electrical device with a cover plate installed.

Referring to FIG. 4, a first implementation of electrical device cover 100 is illustrated partially installed on an electrical device. With the sliding bar 116 withdrawn from the frame channel 114, electrical device mounting screws (not shown) partially loosened, and with frame opening 110 positioned over electrical device 400, a user may position screw channel 112 behind electrical device yoke 402 and align screw channel 112 with electrical device box mounting screw (not shown for clarity) and corresponding screw hole 406. A user may thereafter couple slide bar 116 with frame 101 by aligning one or more slide bar flanges 118 in frame channel 114. In implementations where the slide bar 116 does not completely withdraw from the frame channel 114, the user would not need to align the slide bar flanges 118 in the frame channel 114. A user may then glide slide bar 116 in the direction of top frame member 106 (with screw channel 113 positioned behind electrical device yoke 402) until slide bar 116 reaches a fully engaged position with respect to frame 101 and the screw channel 113 partially surrounds the box mounting screw (not shown). The box mounting screws are then tightened to secure the frame 101 in place on the screw channels 112 and 113. Optionally, a cover plate, such as plate 900 in FIG. 11 or other cover or finish frame may be placed within the frame opening 110 after installation of the frame 101 and sliding tab 116.

Figure 5:
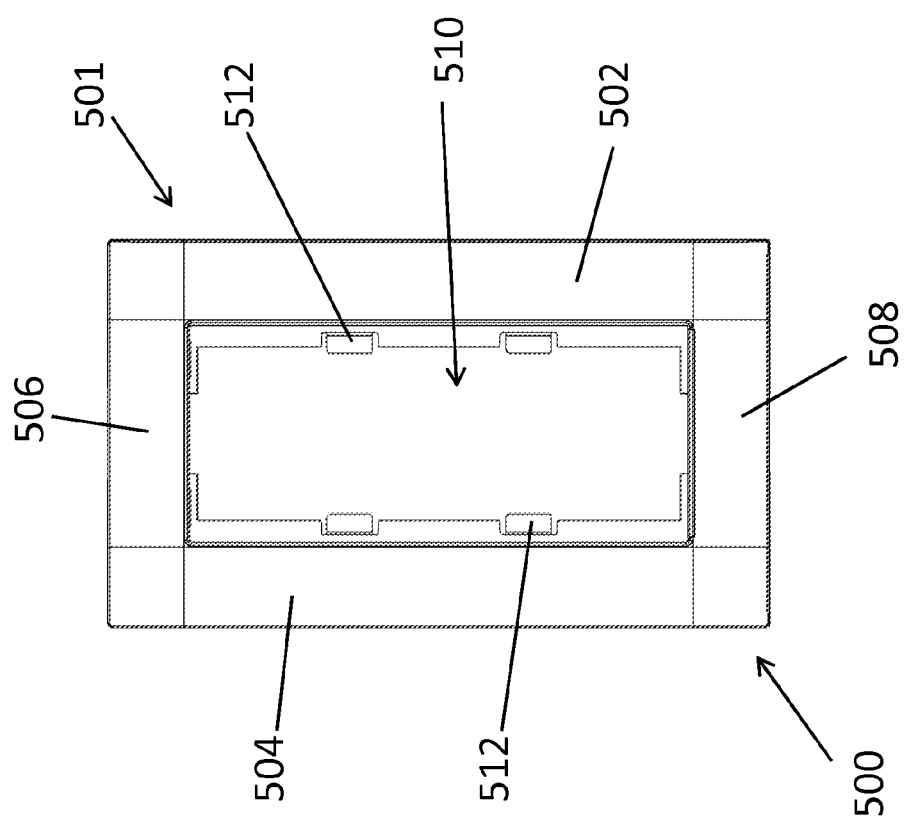
FIG. 5 is a front view of a second implementation of an electrical device cover frame.
Figure 6:
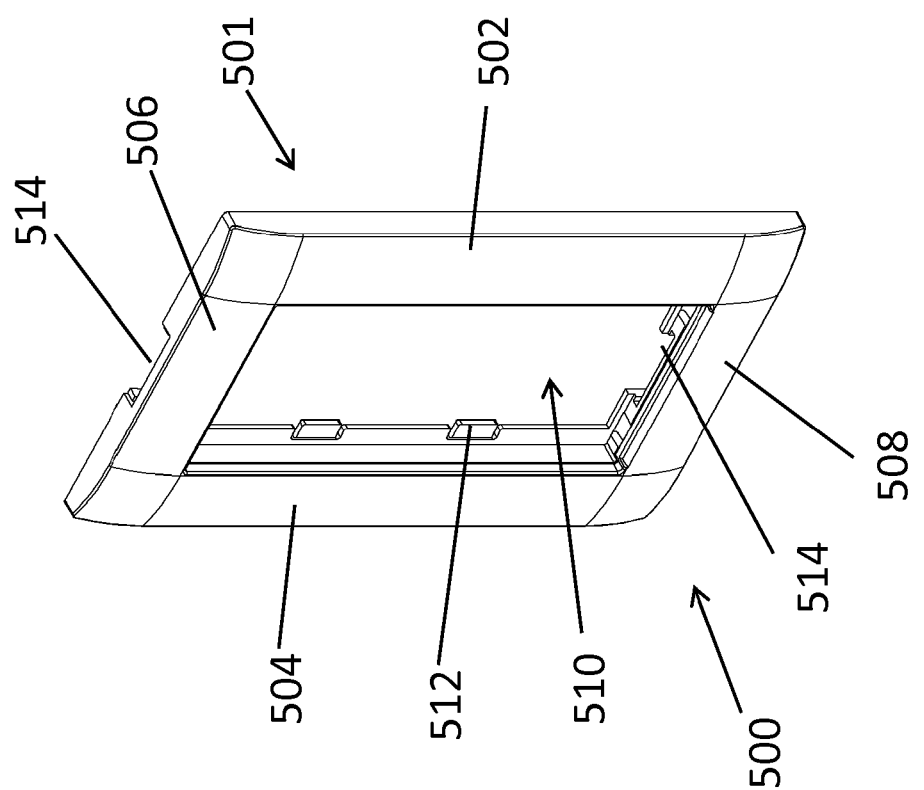
FIG. 6 is a front perspective view of the electrical device cover frame of FIG. 5.
Figure 7:
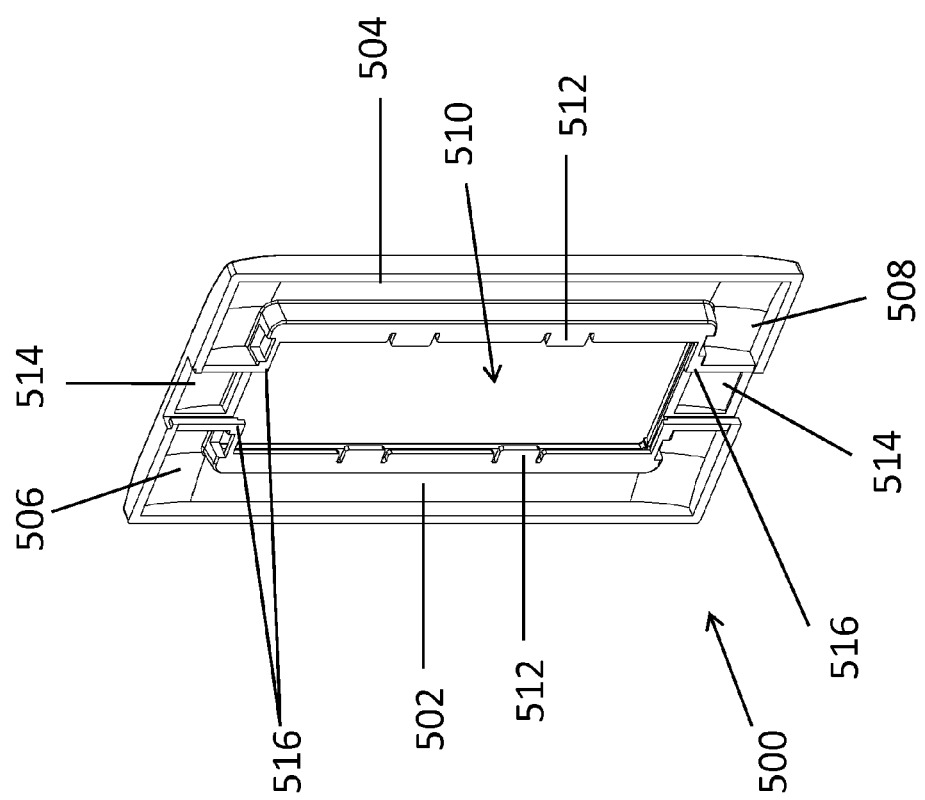
FIG. 7 is a rear perspective view of the electrical device cover frame of FIG. 5.
Figure 8C:
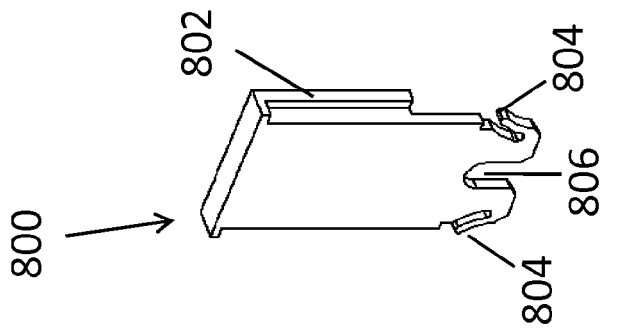
FIGS. 8a, b and c are various views of a particular implementation of a sliding tab.
Figure 8B:
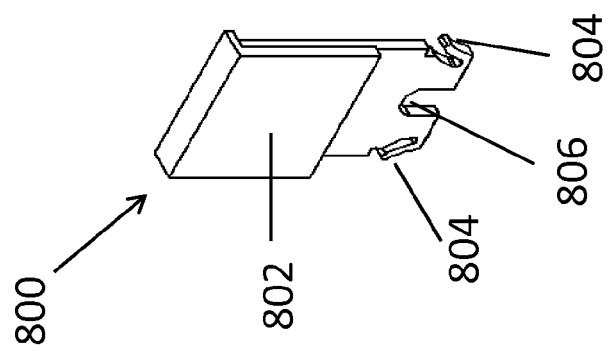
Figure 8A:
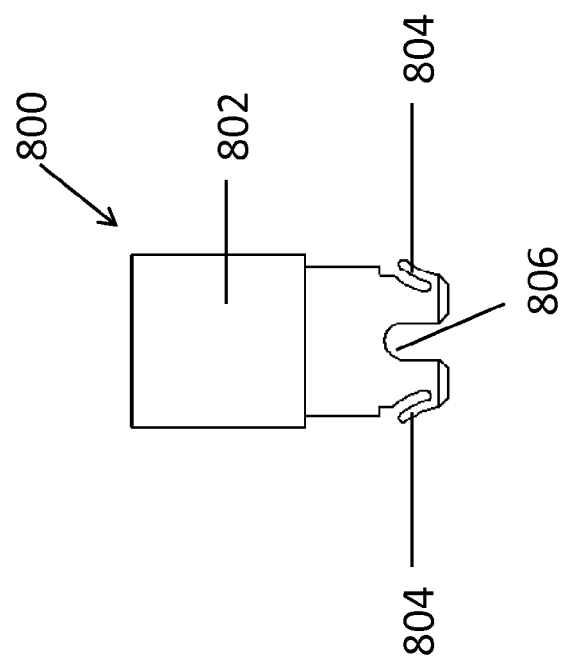
Figure 9:
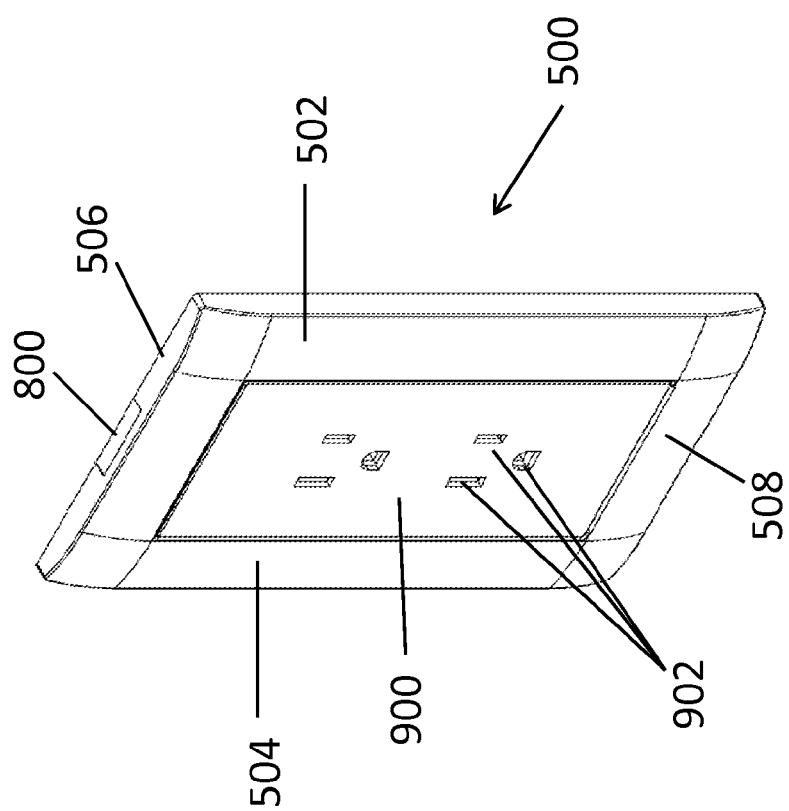
FIG. 9 is a is a front perspective view of the electrical device cover of FIG. 5 installed on an electrical device.

FIG. 5 illustrates a front view of a second implementation of an electrical device cover 500. Frame 501 comprises frame opening 510 defined by at least four sides. In the non-limiting example provided, frame opening 510 is defined by first side member 502, second side member 504, top member 506 and bottom member 508. In addition, frame 501 may comprise one or more removable tabs 512 that may be left intact to accommodate a standard duplex electrical device, or may be removed to accommodate another electrical device such as a ground fault circuit interrupt (GFCI) or "Decora" type switch or electrical outlet, by way of non-limiting example, and as described in U.S. Provisional Patent Application 60/981,428 to Baldwin, the disclosure of which are incorporated herein by reference.

Figure 10:
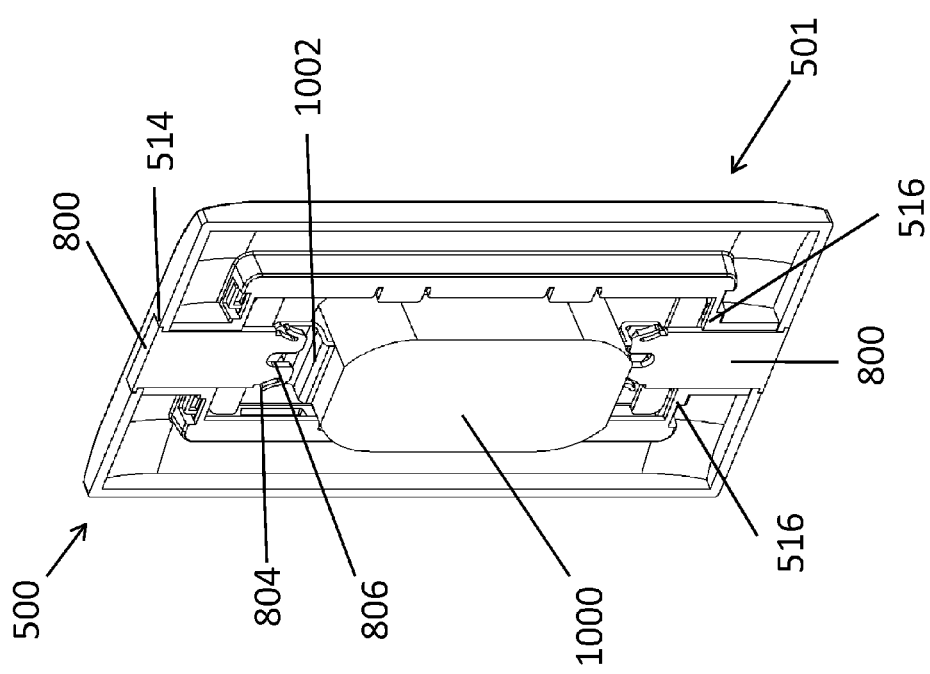
FIG. 10 is a rear perspective view of the electrical device cover of FIG. 5 installed on an electrical device.

In the non-limiting examples provided in FIGS. 6-9, various views of a second implementation of an electrical device cover 500 are illustrated. Frame 501 comprises frame channel 514 and a sliding tab 800 in the form of a push tab 800 for this particular implementation. The frame channel 514 for this particular implementation is configured to lockably receive push tab 800 (FIGS. 8a, 8b, 8c). Push tab 800 may comprise a first end and a second end, the first end comprising push head 802, and the second end comprising screw channel 806, and one or more stops 804. It will be understood that in some implementations one or more push tabs 800 may comprise separate components from frame 501 while in other implementations one or more push tabs 800 may be integral with frame 501. It will likewise be understood that, in particular implementations, one or more push tabs 800 may comprise a first unengaged position (shown in FIG. 11) and a second engaged position (shown in FIG. 10) with respect to frame 501. In addition, one or more push tabs 800 and frame channel 514 may be configured to comprise an engaged position via a pressure fit of the one or more push tabs 800 within frame channel 514. It will be further understood that the configuration of one or more stops 804 (FIGS. 8a, 8b, 8c) and one or more frame channels 514 may hinder complete disengagement of one or more push tabs 800 with respect to frame 501. Specifically, frame channel 514 (FIG. 7) may comprise one or more frame channel shoulders 516 which are configured to engage one or more stops 804, in order to hinder the removal of one or more tabs 800 from one or more frame channels 514 and allow the push tab 800 to be moved from its engaged position (FIG. 10) to its unengaged position (FIG. 11) without concern for the sliding tab falling out of its coupling with the frame channel 514.

Referring to FIGS. 10-14, the installation of a second implementation of electrical device cover 500 on an electrical device is illustrated. With electrical device box mounting screws 1004 (FIG. 11) slightly loosened, and with frame opening 510 positioned over electrical device 1000, a user may thereafter align screw channel 806 of push tab 800 behind electrical device yoke 1002. A user may thereafter slide one or more push tabs 800 in frame channel(s) 514 towards electrical device box mounting screws 1004 in order to engage one or more push tabs 800 with respect to electrical device 1000 (via box mounting screw 1004). With one or more push tabs 800 fully engaged with respect to electrical device box mounting screw(s) 1004 (and frame 501), a user may thereafter tighten the electrical device mounting screws 1004. For particular implementations, such as the one shown in FIGS. 10-14, a user may snap-in a face plate 900 (FIG. 14) to cover frame opening 510, or other cover plate frame to fill in the gap between the electrical device 1000 and the sides of the frame 500. It will be understood that one or more frame channel shoulders 516 may impinge one or more stops 804 in the event that one or more push tabs 800 are slid away from electrical device 1000, thereby preventing the removal of one or more push tabs 800 from one or more frame channels 514.

Figure 15:
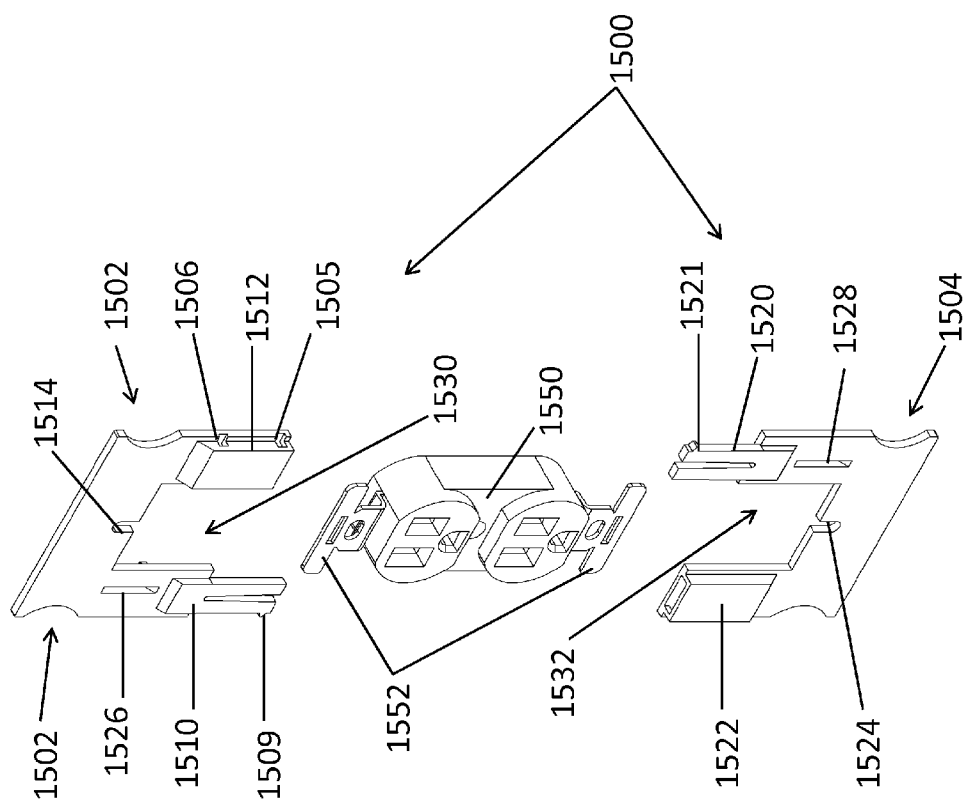
FIG. 15 is an exploded front view of a third implementation of an electrical device cover.

FIG. 15 illustrates an unassembled perspective view of a third implementation of an electrical device cover 1500 in the form of a frame 1500 for this particular implementation. Frame 1500 comprises first frame portion 1502 and a second frame portion 1504 which, together, slidably couple to comprise frame opening 1503. In addition, first frame portion 1502 and second frame portion 1504 comprise a first coupled (open) position and a second coupled (closed) position, described more fully below. First frame portion 1502 for this particular implementation comprises U-shaped portion 1530, frame channel 1512, frame channel opening (not shown), first frame channel notch 1505, and second frame channel notch 1506. First frame portion 1502 further comprises screw channel 1514, locking pin slot 1526 and sliding tab 1510, which comprises detent 1509. Second frame portion 1504 may be formed as a duplicate of the first frame portion 1502 or differently, but in either case comprises U-shaped portion 153 and frame channel 1522, which comprises frame channel opening 1521, first frame channel notch (not shown) and second frame channel notch (not shown). Second frame portion 1502 further comprises screw channel 1524, locking pin slot 1528 and sliding tab 1520, which comprises detent 1521.

Figure 16:
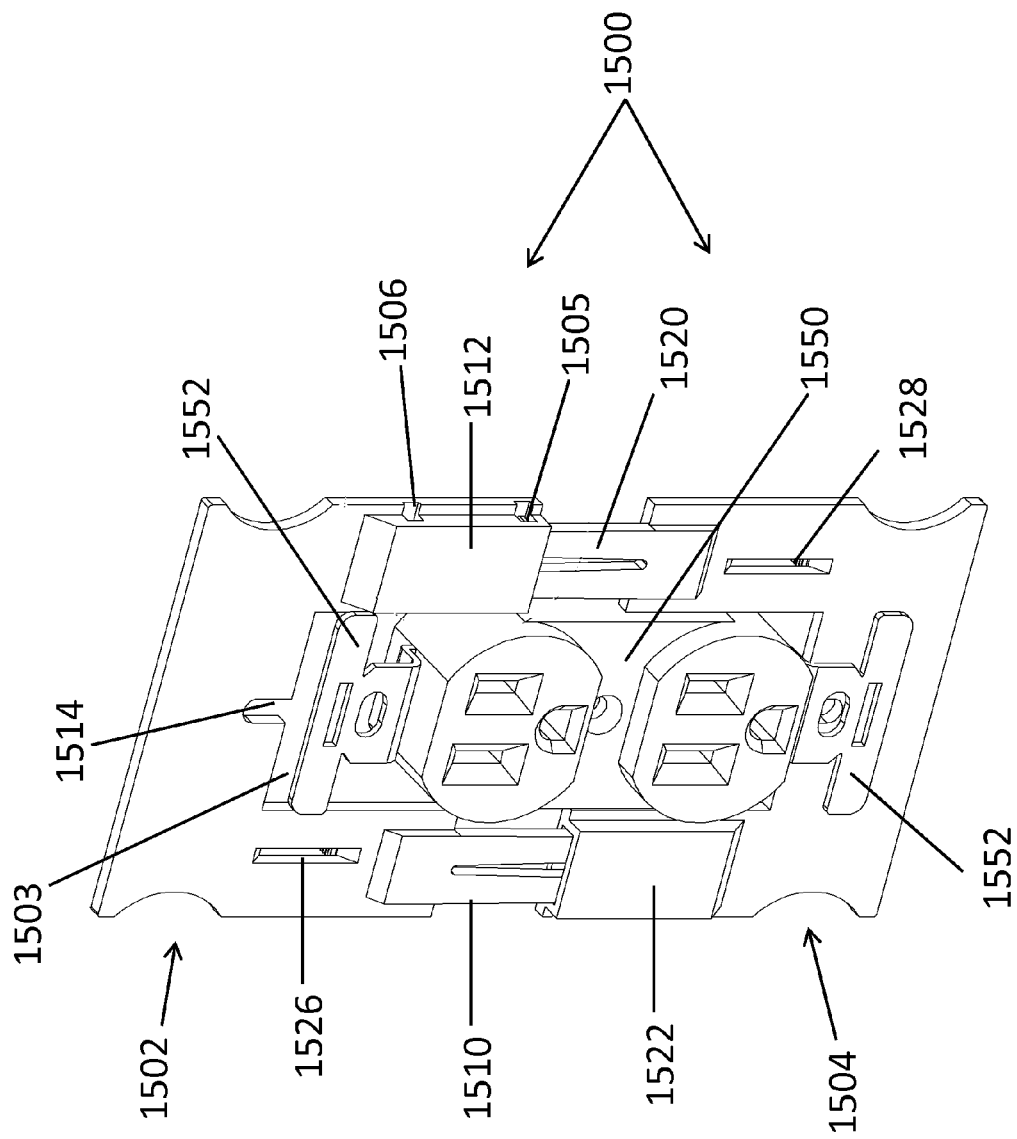
FIG. 16 is a perspective view of the electrical device cover of FIG. 15 in a partially installed position.
Figure 17:
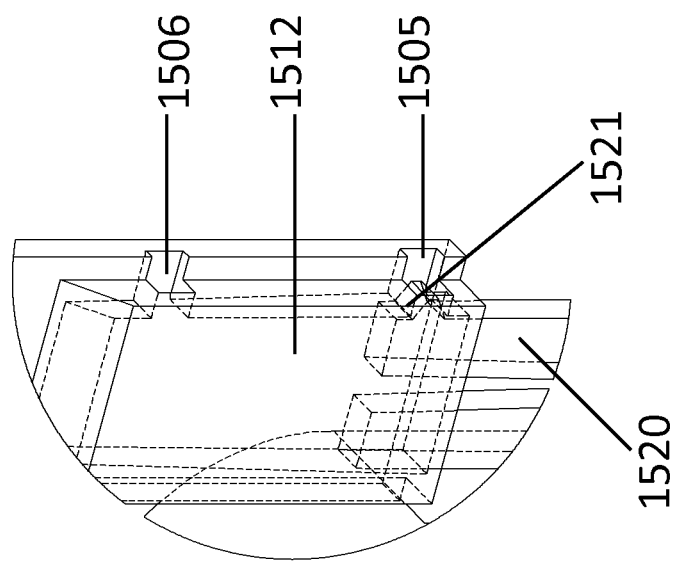
FIG. 17 is a see-through detail view of a portion of the frame channel and sliding tab of the implementation shown in FIG. 15.

FIGS. 16-17 illustrate perspective views of the third implementation of electrical device cover 1500 in a first coupled (open) position. In the first coupled (open) position, sliding tab 1510 is be aligned with frame channel opening 1521 of frame channel 1522 (FIG. 15) and sliding tab 1520 is aligned with frame channel opening of frame channel 1512. The detent 1521 in the first coupled (open) position is positioned within first frame channel notch 1505 of frame channel 1512, and detent 1509 is positioned within first frame channel notch of frame channel 1522. It will be understood that a second coupled (closed) position comprises detent 1521 positioned within second frame channel notch 1506 of frame channel 1512 and detent 1509 positioned within second frame channel notch of frame channel 1522. It will be further understood that a user may slidably position electrical device cover 1500 between a first coupled position and a second coupled position by adjusting the position of detent 1521 and detent 1509 with respect to their respective frame channel notches. This may be accomplished by simply squeezing the first and second frame portions 1502 and 1504 together.

Still referring to FIGS. 16-17, with electrical device box mounting screws (not shown for clarity in the illustration) slightly loosened, and with frame opening 1503 in its first coupled position and positioned over electrical device 1550, a user may thereafter position screw channel 1514 and screw channel 1524 behind electrical device yokes 1552 so that screw channel 1514 and screw channel 1524 are aligned with the one or more electrical device box mounting screws which will extend through the electrical device box mounting screw holes. With screw channel 1514 and screw channel 1524 aligned with the one or more mounting screws, a user may slidably engage frame 1500 from a first coupled (open) position to a second coupled (closed) position. After engaging frame 1500 to its second coupled position, a user may thereafter tighten the one or more electrical device mounting screws and complete the installation of frame 1500.

Figure 18:
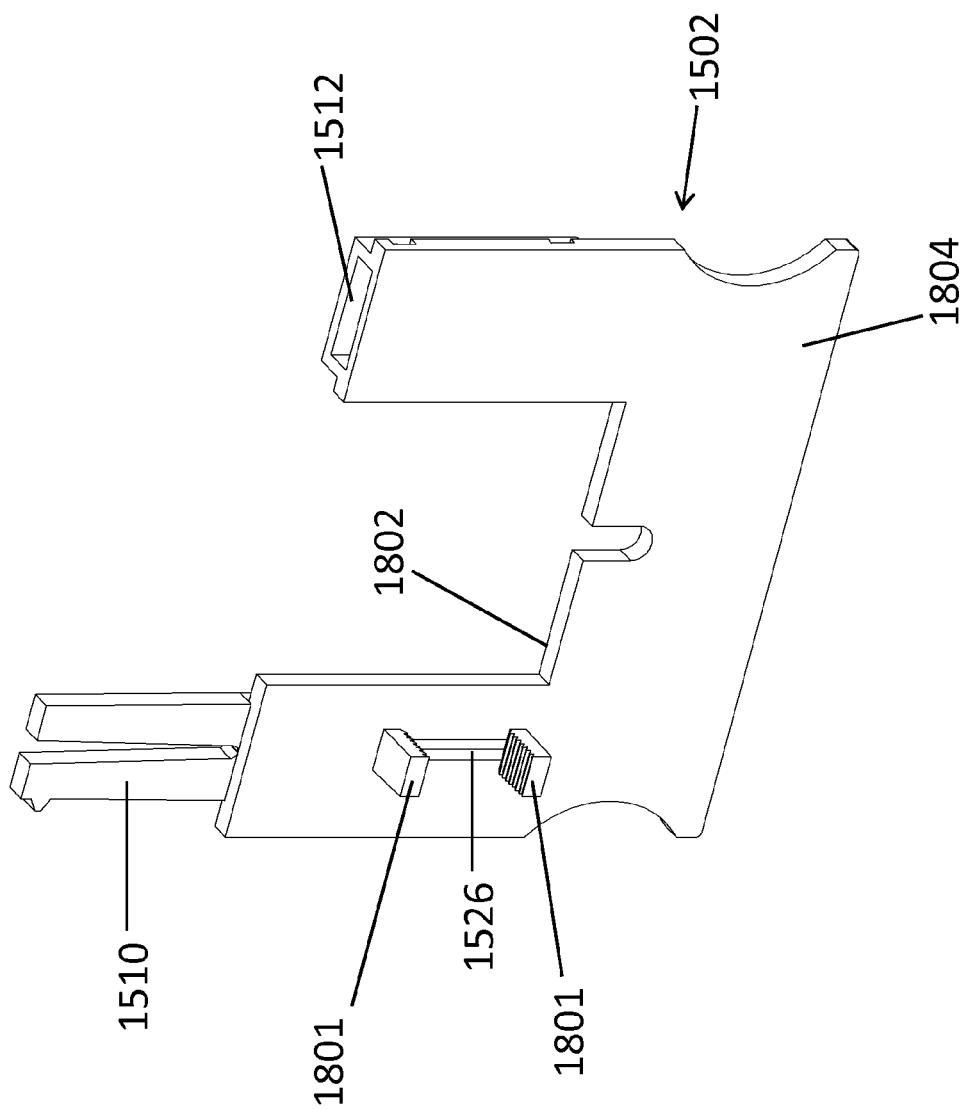
FIG. 18 is a rear perspective view of an electrical device frame component.
Figure 19:
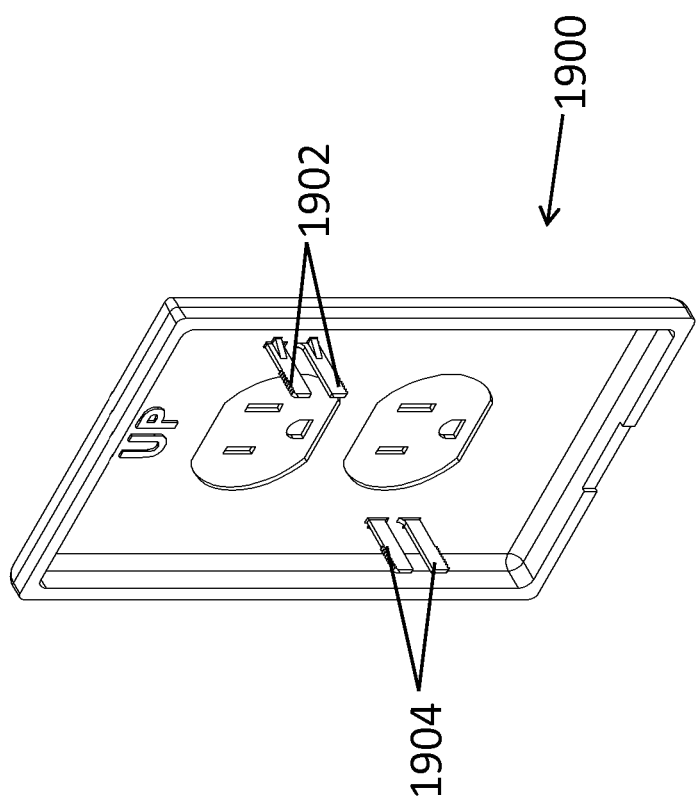
FIG. 19 is a rear perspective view of a cover plate.
Figure 20:
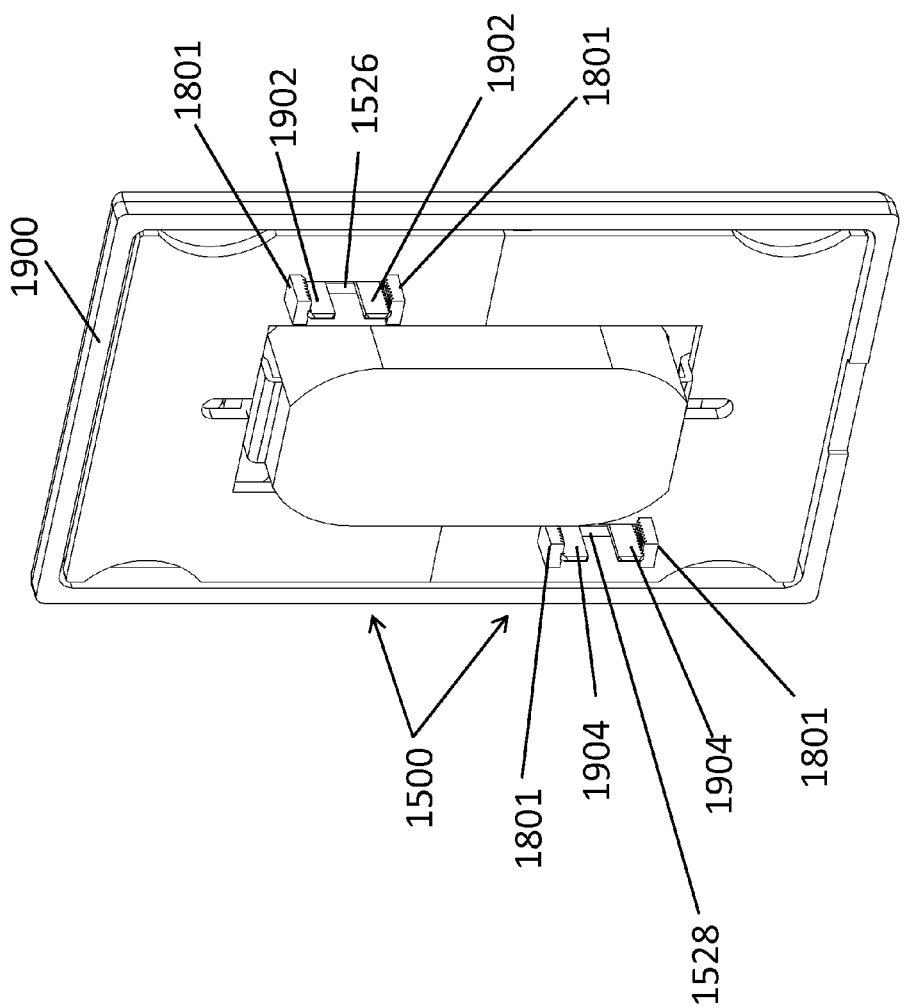
FIG. 20 is a rear perspective view of the electrical device cover of FIG. 15 with a cover plate coupled with the electrical device frame.

Referring to FIGS. 18-20, in particular implementations of an electrical device cover, an additional cover plate 1900 may be included and coupled to the frame 1500. FIG. 18 shows a close-up view of a rear side 1804 of a first frame portion 1502 that opposes a front side 1802. First frame portion 1502 comprises locking pin slot 1526, which passes through first frame portion 1502 from front side 1802 to rear side 1804. Locking pin slot 1526 comprises two or more opposing flanges 1801, which are configured to impinge one or more locking pins extending from a rear side of cover plate 1900 (FIG. 19). The second frame portion 1504 that cooperates with the first frame portion 1502 to form the frame 1500 would also include similarly configured front and rear sides and a locking pin slot 1528 (FIG. 20) extending through the frame.

In particular, referring specifically to FIG. 19, cover plate 1900 may comprise one or more upper locking pins 1902 and one or more lower locking pins 1904. As can be seen in the non-limiting example provided in FIG. 20, the one or more upper locking pins 1902 comprising cover plate 1900 may be inserted through locking pin slot 1526, and may be impinged between the two or more opposing flanges 1801. Likewise, the one or more lower locking pins 1904 comprising cover plate 1900 may be inserted through locking pin slot 1526, and may be impinged between the two or more opposing flanges 1801. It will be understood that with upper locking pins 1902 and lower locking pins 1904 impinged between one or more opposing flanges 1801, cover plate 1900 will be fixed in position with respect to frame 1500 (FIG. 20). More complicated coupling methods may be used and locking features to lock the cover plate 1900 to the frame 1500, but they are not required in every implementation.

It will be understood by those of ordinary skill in the art that the concept of using sliding tabs and frame to couple electrical device cover frame to the electrical device box mounting screws as disclosed herein is not limited to indoor covers or to the specific implementations shown herein. For example, it is specifically contemplated that the sliding tabs comprising screw channels may be implemented as part of a while in use electrical outlet cover base that comprises hinge members on one or more sides of the base that mate with hinge members on one or more sides of a corresponding lid. There are many while in use electrical outlet cover designs and styles in existence and many of these styles would be benefitted by the aspects associated with sliding tabs. By non-limiting example, U.S. Pat. No. 5,763,831 to Shotey, 6,133,531 to Hayduke, and U.S. Pat. No. 7,282,643 to Shotey, the disclosures of which are hereby incorporated by reference, include examples of while in use electrical outlet covers. It should be noted that combination covers that allow for both horizontal and vertical mounting of the cover as well as single orientation covers may benefit from sliding tabs comprising screw channels rather than the conventional mounting screw holes in the base these patents disclose.

The components included in a particular implementation of an electrical device cover may be formed of any of many different types of materials or combinations that can readily be formed into shaped objects and that are consistent with the intended operation of an electrical device cover. For example, the components may be formed of: rubbers (synthetic and/or natural) and/or other like materials; polymers and/or other like materials; plastics, and/or other like materials; composites and/or other like materials; metals and/or other like materials; alloys and/or other like materials; and/or any combination of the foregoing.

Furthermore, the frame, sliding tabs, cover plates and any other components forming a particular implementation of an electrical device cover may be manufactured separately and then assembled together, or any or all of the components may be manufactured simultaneously and integrally joined with one another. Manufacture of these components separately or simultaneously may involve extrusion, pultrusion, vacuum forming, injection molding, blow molding, resin transfer molding, casting, forging, cold rolling, milling, drilling, reaming, turning, grinding, stamping, cutting, bending, welding, soldering, hardening, riveting, punching, plating, and/or the like. If any of the components are manufactured separately, they may then be coupled or removably coupled with one another in any manner, such as with adhesive, a weld, a fastener, any combination thereof, and/or the like for example, depending on, among other considerations, the particular material(s) forming the components.

It will be understood that implementations are not limited to the specific components disclosed herein, as virtually any components consistent with the intended operation of a method and/or system implementation for an electrical device cover may be utilized. Accordingly, for example, although particular bases, lids, and cord ports may be disclosed, such components may comprise any shape, size, style, type, model, version, class, grade, measurement, concentration, material, weight, quantity, and/or the like consistent with the intended operation of a method and/or system implementation for an electrical device cover may be used.

In places where the description above refers to particular implementations of an electrical device cover, it should be readily apparent that a number of modifications may be made without departing from the spirit thereof and that these implementations may be applied to other electrical device covers. The accompanying claims are intended to cover such modifications as would fall within the true spirit and scope of the disclosure set forth in this document. The presently disclosed implementations are, therefore, to be considered in all respects as illustrative and not restrictive, the scope of the disclosure being indicated by the appended claims rather than the foregoing description. All changes that come within the meaning of and range of equivalency of the claims are intended to be embraced therein.

The invention claimed is:

1. An electrical device cover configured for mounting over an electrical device, the electrical device cover comprising:
   a frame comprising a frame channel and an frame opening, the frame opening defined by at least four sides, the frame opening large enough to receive at least one electrical device; and
   a sliding tab comprising a screw channel, the sliding tab slidably coupled with the frame channel and slideable to a closed position in which the screw channel at least partially surrounds a box mounting screw of the at least one electrical device, said sliding tab having a locking clip extending from a side of said sliding tab and configured to engage said frame adjacent said frame channel.

2. The electrical device cover of claim 1, wherein the frame opening is defined by a one piece frame comprising the at least four sides.

3. The electrical device cover of claim 1, wherein the sliding tab and frame are formed as separate pieces.

4. The electrical device cover of claim 1, wherein the frame opening comprises at least one screw channel disposed along a perimeter of the frame opening.

5. The electrical device cover of claim 1, wherein the sliding tab comprises one or more stops extending from one or more sides of the sliding tab.

6. The electrical device cover of claim 1, further comprising a cover plate coupled with the frame at the frame opening, the cover plate configured to cover at least a portion of the at least one electrical device.

7. The electrical device cover of claim 1, further comprising a lid hingedly coupled to the frame.

8. An electrical device cover configured for mounting over an electrical device, the electrical device cover comprising:
- a frame having a first end wall and a second end wall opposite said first end wall, and side walls defining a frame opening with a dimension to receive at least one electrical device, said first end wall having an outwardly facing opening and an open channel; and
- a first sliding tab being slidably coupled with said channel and slideable to a closed position where said first sliding tab is positioned between an electrical box and a yoke of the at least one electrical device for coupling said electrical device cover to the electrical box and at least one electrical device.

9. The electrical device cover of claim 8, wherein said first sliding tab has a side with an outwardly extending a locking clip configured to engage the frame adjacent to said channel.

10. The electrical device cover of claim 8, wherein said first sliding tab has an end with an outwardly extending first flange and a second end with an outwardly extending second flange, each of said flanges engaging said open channel.

11. The electrical device cover of claim 10, wherein said open channel includes a first frame channel extending inwardly from said opening in said first end wall for receiving said first flange, and a second frame channel extending inwardly from said opening in said first end wall for receiving said second flange.

12. The electrical device cover of claim 8, wherein said second end has an outwardly facing opening opposite said first opening and includes an open channel, and a second sliding tab having a screw channel coupled to said open channel in said second end and slideable to a closed position to at least partially surround a box mounting screw of the at least one electrical device.

13. The electrical device cover of claim 12, wherein said second sliding tab having a dimension to be positioned between the at least one electrical box and a mounting yoke of the electrical device for coupling said electrical device cover to the electrical box and the at least one electrical device.

14. The electrical device cover of claim 13, wherein said first sliding tab and said second sliding tab have a screw channel for at least partially surrounding a box mounting screw.

15. The electrical device cover of claim 8, further comprising
a face plate received in said frame opening.

16. The electrical device cover of claim 8, wherein said sliding tab has a first outer end and a second inner end, said inner end having at least one locking clip for coupling with said frame.

17. The electrical device cover of claim 16, wherein said open channel has a shoulder for coupling with said at least one locking clip.

18. A method of installing an electrical device cover, the method comprising:
- placing a first sliding tab at a first end of a frame behind a yoke of an electrical device;
- aligning a screw channel on the sliding tab slidably mounted in the frame with a mounting screw of the electrical device;
- sliding the sliding tab toward the mounting screw to a position where the screw channel at least partially surrounds the mounting screw and sliding the sliding tab into an outwardly facing a first channel of the frame to position the sliding tab between an electrical box and the yoke of the electrical device; and
- tightening the mounting screw against the sliding tab.

19. The method of claim 18, further comprising coupling a cover plate with the frame.

20. The method of claim 19, wherein said electrical device cover has a second sliding tab at a second end of the frame, said method comprising sliding said second tab into a second channel of said frame and between the electrical box and the electrical device.

* * * * *